(12) United States Patent
Zuo et al.

(10) Patent No.: US 9,425,761 B2
(45) Date of Patent: Aug. 23, 2016

(54) HIGH PASS FILTERS AND LOW PASS FILTERS USING THROUGH GLASS VIA TECHNOLOGY

(71) Applicant: QUALCOMM Incorporated, San Diego, CA (US)

(72) Inventors: Chengjie Zuo, Santee, CA (US); Jonghae Kim, San Diego, CA (US); Changhan Hobie Yun, San Diego, CA (US); Daeik Daniel Kim, San Diego, CA (US); Mario Francisco Velez, San Diego, CA (US); Je-Hsiung Lan, San Diego, CA (US); Robert Paul Mikulka, Oceanside, CA (US); Matthew Michael Nowak, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 66 days.

(21) Appl. No.: 14/055,707

(22) Filed: Oct. 16, 2013

(65) Prior Publication Data
US 2014/0354378 A1   Dec. 4, 2014

Related U.S. Application Data

(60) Provisional application No. 61/829,714, filed on May 31, 2013.

(51) Int. Cl.
*H03H 7/01* (2006.01)
*H04B 1/04* (2006.01)

(52) U.S. Cl.
CPC .......... *H03H 7/0138* (2013.01); *H03H 7/0115* (2013.01); *Y10T 29/417* (2015.01)

(58) Field of Classification Search
USPC .................................. 333/168, 175, 177, 185
See application file for complete search history.

(56) References Cited

U.S. PATENT DOCUMENTS 5,696,471 A   12/1997   Fujiwara
6,992,557 B2   1/2006   Aoyagi
(Continued)

FOREIGN PATENT DOCUMENTS

WO     2012087287 A1    6/2012

OTHER PUBLICATIONS

Hwang, S., et al., "Thin-Film High-Rejection Filter Integration in Low-Loss Organic Substrate", IEEE Transactions on Components, Packaging and Manufacturing Technology, IEEE, USA, vol. 1, No. 8, Aug. 1, 2011, pp. 1160-1170, XP011389459, ISSN: 2156-3950, DOI: 10.1109ATCPMT.2011.2142398.
(Continued)

*Primary Examiner* — An Luu
(74) *Attorney, Agent, or Firm* — Seyfarth Shaw LLP

(57) ABSTRACT

A filter includes a glass substrate having through substrate vias. The filter also includes capacitors supported by the glass substrate. The capacitors may have a width and/or thickness less than a printing resolution. The filter also includes a 3D inductor within the substrate. The 3D inductor includes a first set of traces on a first surface of the glass substrate coupled to the through substrate vias. The 3D inductor also includes a second set of traces on a second surface of the glass substrate coupled to opposite ends of the through substrate vias. The second surface of the glass substrate is opposite the first surface of the glass substrate. The through substrate vias and traces operate as the 3D inductor. The first set of traces and the second set of traces may also have a width and/or thickness less than the printing resolution.

21 Claims, 11 Drawing Sheets

(56) References Cited

U.S. PATENT DOCUMENTS

| | | | |
|---|---|---|---|
| 7,724,117 | B2 | 5/2010 | Goyette et al. |
| 7,859,364 | B2 | 12/2010 | Sakisaka et al. |
| 2007/0034989 | A1 | 2/2007 | Shioga et al. |
| 2010/0207715 | A1 | 8/2010 | Pouplier |
| 2011/0291786 | A1 | 12/2011 | Li et al. |
| 2013/0207745 | A1* | 8/2013 | Yun .............. H03H 7/1708 333/185 |
| 2014/0104284 | A1* | 4/2014 | Shenoy .............. G09G 5/00 345/501 |

OTHER PUBLICATIONS

International Search Report and Written Opinion—PCT/US2014/031779—ISA/EPO—Sep. 3, 2014.

Mi X. et al., "Integrated Passives for High-Frequency Applications", Apr. 1, 2010, pp. 249-290, XP055136526, DOI: 10.5772/8418, ISBN: 978-9-53-307087-2, Retrieved from the Internet: URL:http://cdn.intechopen.com/pdfs/9635.pdf[retrieved on Aug. 26, 2014].

Sridharan V. et al., "Design and fabrication of bandpass filters in glass interposer with through-package-vias (TPV)", Electronic Components and Technology Conference(ECTC), 2010 Proceedings 60th, IEEE, Piscataway, NJ, USA, Jun. 1, 2010, pp. 530-535, XP031694140.

Topper M. et al., "3-D Thin film interposer based on TGV (Through Glass Vias): An alternative to Si-interposer", Electronic Components and Technology Conference (ECTC), 2010 Proceedings 60th, IEEE, Piscataway, NJ, USA, Jun. 1, 2010, pp. 66-73, XP031694110, ISBN: 978-1-4244-6410-4.

* cited by examiner

HIGH PASS FILTERS AND LOW PASS FILTERS USING THROUGH GLASS VIA TECHNOLOGY

CROSS-REFERENCE TO RELATED APPLICATION

The present application claims the benefit of U.S. Provisional Patent Application No. 61/829,714 filed on May 31, 2013, in the names of C. Zuo et al., the disclosure of which is expressly incorporated by reference herein in its entirety.

TECHNICAL FIELD

The present disclosure generally relates to integrated circuits (ICs). More specifically, one aspect of the present disclosure relates to design for high pass filters and low pass filters using through substrate via (e.g., through glass via) technology.

BACKGROUND

Low pass filters and high pass filters can be used for rejecting harmonics in communication signals. Low pass filters and high pass filters can also be used in carrier aggregation systems that combine multiple component carriers to achieve high data transmission rates in wireless communications. In carrier aggregation applications, however, low pass filters and high pass filters specify very low levels of insertion loss, which are very difficult to achieve for conventional technologies (e.g., low temperature co-fired ceramic devices). Insertion loss is a metric, usually measured in decibels (dB), that expresses the loss of signal power resulting from the insertion of a device (e.g., a low pass filter or a high pass filter) into a transmission system (e.g., a wireless network). The lower the insertion loss, the more stable and powerful the device is in efficiently propagating signals through a network.

The filter fabrication process may be compatible with standard semiconductor manufacturing processes (e.g., processes for fabricating voltage-controlled capacitors (varactors), switched-array capacitors, or other like capacitors). It may be beneficial to fabricate the components of the filter on a single substrate. Fabrication on a single substrate may also enable the creation of filters having a number of adjustable parameters due to process variables.

Fabricating high performance filters with low insertion loss is a challenge. Furthermore, reducing the electromagnetic coupling between the various components in a filter design, while decreasing the size of the filter, is also a challenge. A filter design that achieves low insertion loss, while being fabricated in an efficient and economical manner would be beneficial.

SUMMARY

In one aspect of the present disclosure, a filter is disclosed. The filter includes a glass substrate having through substrate vias. The filter also includes capacitors supported by the glass substrate, in which one of the capacitors has a width and/or thickness less than a printing resolution. The filter also includes a 3D inductor within the glass substrate. The 3D inductor has a first set of traces on a first surface of the glass substrate that are coupled to the through substrate vias. The 3D inductor also has a second set of traces on a second surface of the glass substrate, opposite the first surface, that are coupled to opposite ends of the through substrate vias. The through substrate vias and traces operate as the 3D inductor.

The first set of traces and the second set of traces may also have a width and/or thickness less than the printing resolution.

Another aspect discloses a method of fabricating a filter. The method includes forming through substrate vias in a glass substrate. The method also includes depositing a first set of traces on a first surface of the glass substrate. The method also includes depositing a second set of traces on a second surface of the glass substrate. The first set of traces and the second set of traces may have a width and/or thickness less than a printing resolution. The method further includes coupling the first set of traces to a first side of the through substrate vias and coupling the second set of traces to a second side of the through substrate vias to form a 3D inductor. The method also includes forming a capacitor on the glass substrate. The capacitor may have a width and/or thickness less than the printing resolution.

In yet another aspect, a filter is disclosed. The filter includes a glass substrate having through substrate vias. The filter also includes means for storing charge supported by the glass substrate. The charge storing means may have a width and/or thickness less than a printing resolution. The filter also includes a 3D inductor within the glass substrate. The 3D inductor includes a first means for coupling on a first surface of the glass substrate. The first means for coupling is coupled to the through substrate vias. The 3D inductor also includes a second means for coupling on a second surface of the glass substrate, opposite the first surface. The second means for coupling is coupled to opposite ends of the through substrate vias. The through substrate vias, the first means for coupling and the second means for coupling operate as the 3D inductor. Also, the first means for coupling and the second means for coupling may have a width and/or thickness less than the printing resolution.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Figure 1:
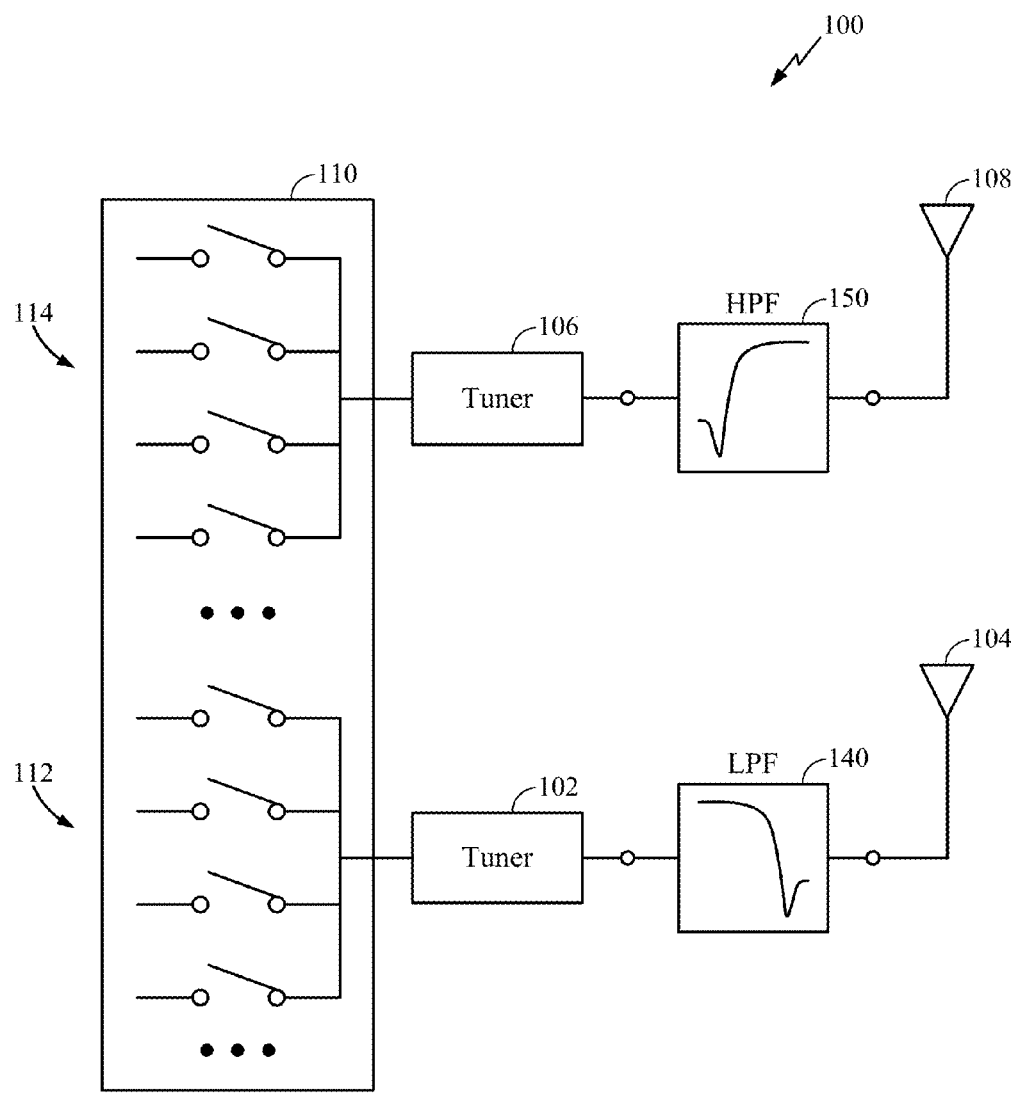
FIG. 1 is a schematic diagram of a dual-feed antenna chipset employing filters according to an aspect of the present disclosure.

FIG. 1 is a schematic diagram of a dual-feed antenna chipset 100 employing filters according to an aspect of the present disclosure. The dual-feed antenna chipset 100 includes a low pass filter 140 and a high pass filter 150. The dual-feed antenna chipset 100 may be used for carrier aggregation purposes, where both high band and low band frequencies are used at the same time for wireless communications. Conventional low-pass filters and high-pass filters have a high insertion loss that is usually around 0.3 dB. This level of insertion loss is too high for carrier aggregation applications because of significant signal power loss from the high pass filter 150 and the low pass filter 140. In one aspect of the present disclosure, the low pass filter 140 and the high pass filter 150 of the dual-feed antenna chipset 100 may be designed and implemented to achieve low insertion losses less than 0.2 dB.

Representatively, a first antenna 104 is coupled to the input of the low pass filter 140, and a second antenna 108 is coupled to the input of the high pass filter 150. The first antenna 104 and the second antenna 108 communicate signals processed by the low pass filter 140 and the high pass filter 150. A first antenna tuner 102 is coupled to one port of the low pass filter 140. A second antenna tuner 106 is coupled to one port of the high pass filter 150. The first antenna tuner 102 and the second antenna tuner 106 are optional, but if present they adjust the impedance of the first antenna 104 or second antenna 108 for a better matching with the rest of the circuit. The first antenna tuner 102 and the second antenna tuner 106 are also coupled to a set of switches 110. The set of switches 110 may be used to select the desired operating frequency band for wireless communication. The set of switches 110 can also be divided into a low band frequency part 112 (e.g., 1 GHz) and a high band frequency part 114 (e.g., 2 GHz). The low band frequency part 112 coordinates signals having low band frequencies that are processed by the low pass filter 140. The high band frequency part 114 coordinates high band frequencies that are processed by the high pass filter 150.

In conventional implementations, the insertion loss of the low pass filter 140 and the high pass filter 150 would be around 0.3 dB. This insertion loss may also be too high for carrier aggregation applications, and results in undue amounts of signal power loss and heat generation. In the dual-feed antenna chipset 100 configuration of FIG. 1, the low pass filter 140 and the high pass filter 150 may be configured to have lower insertion loss, for example, as shown in FIGS. 3A-3C and 4A-4C.

Figure 2:
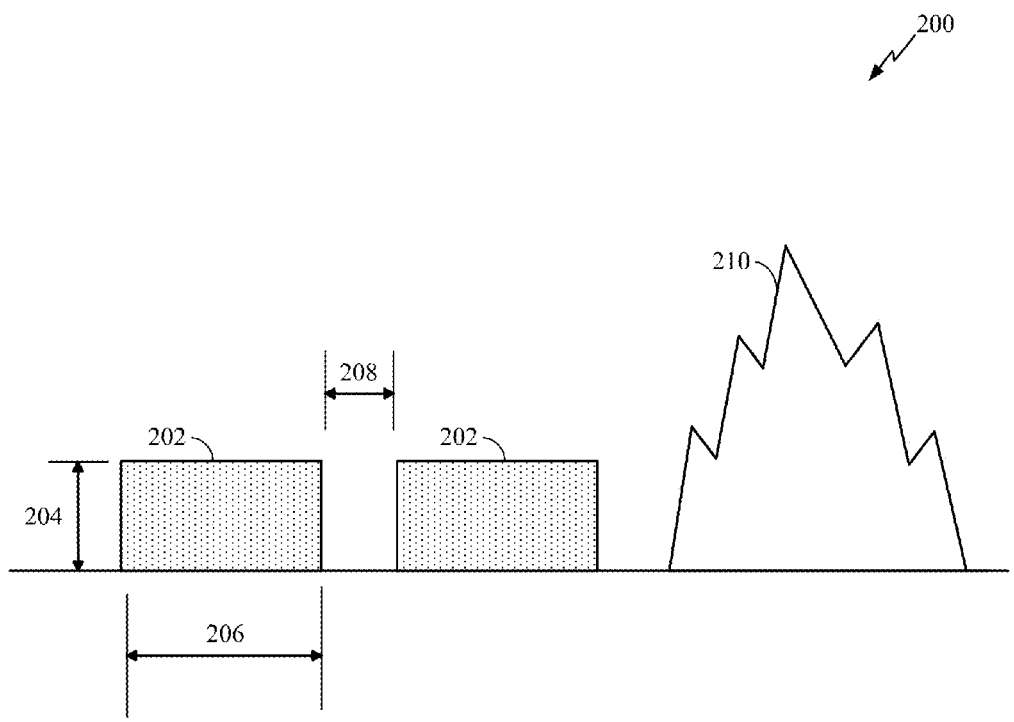
FIG. 2 is a side view of devices fabricated with a semiconductor fabrication process and a printing process according to an aspect of the present disclosure.

FIG. 2 is a side view 200 of devices fabricated with a semiconductor fabrication process and a printing process according to an aspect of the present disclosure. A first device 202 is fabricated with a semiconductor fabrication process used by the present disclosure. A second device 210 is fabricated with a printing process. The first device 202 includes straight, substantially planar edges and surfaces. The first device 202 also includes a device thickness 204, a device width 206 and a device spacing 208, which may all be uniform among multiple ones of the first devices 202, as shown in the side view 200 of FIG. 2. Because the second device 210 is irregular, it does not have a uniform height, width or spacing. The second device 210, being of an irregular shape, has no substantially planar edges or surfaces. In one configuration, the first device 202 is a capacitor/inductor used in the designs of the present disclosure. The device thickness 204 may be less than a printing resolution thickness of 1 μm. The device width 206 may be less than a printing resolution width of 10 μm. The device spacing 208 may be less than a printing resolution spacing of 10 μm.

Figure 3A:
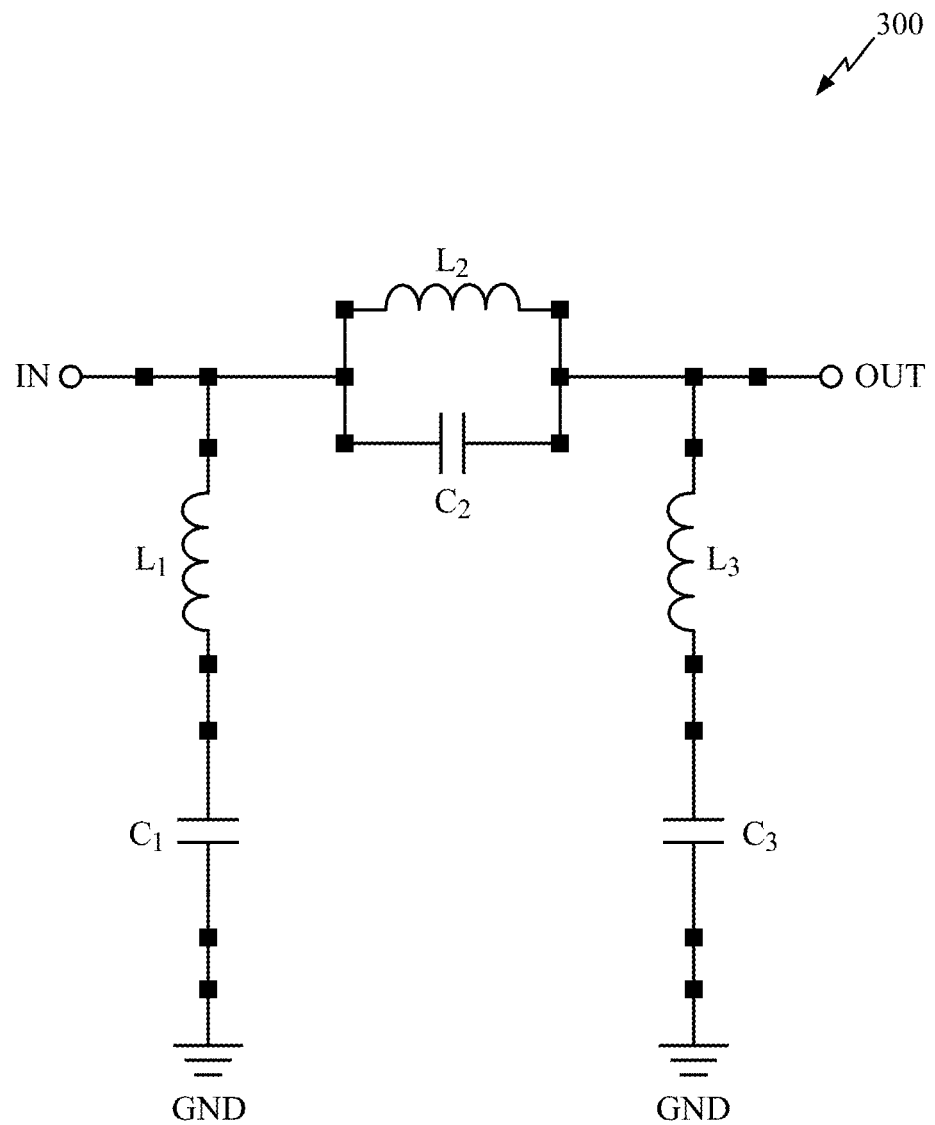
FIG. 3A is a schematic diagram of a filter design according to an aspect of the present disclosure.

FIG. 3A is a schematic diagram of a filter design 300 according to an aspect of the present disclosure. In one configuration, the filter design 300 is for a low pass filter. The filter design 300 includes an input port (IN) and an output port (OUT). A first inductor ($L_1$) is coupled to the input port IN. A first capacitor ($C_1$) is coupled to the first inductor ($L_1$) on one end and a ground terminal (GND) on another end. A second inductor ($L_2$) and a second capacitor ($C_2$) are coupled between the input port (IN) and the output port (OUT). The second inductor ($L_2$) is coupled in parallel with the second capacitor ($C_2$). The first inductor ($L_1$) is also coupled to both the second inductor ($L_2$) and the second capacitor ($C_2$). A third inductor ($L_3$) is coupled to both the second inductor ($L_2$) and the second capacitor ($C_2$). The output port (OUT) is coupled to the third inductor ($L_3$). A third capacitor ($C_3$) is coupled to the third inductor ($L_3$) and the ground terminal (GND).

In one configuration, the first inductor ($L_1$) and the first capacitor ($C_1$) may switch positions and be interchangeable because they are in series. In another configuration, the second inductor ($L_2$) and the second capacitor ($C_2$) may switch positions and be interchangeable because they are parallel. In a further configuration, the third inductor ($L_3$) and the third capacitor ($C_3$) may switch positions and be interchangeable because they are in series. The configuration of the filter design 300, therefore, is not limited to the configuration shown in FIG. 3A. For example, the input and output ports can be swapped. The filter design 300 as a low pass filter can also have a higher order with more capacitors and inductors or a lower order with fewer capacitors and inductors.

Figure 3B:
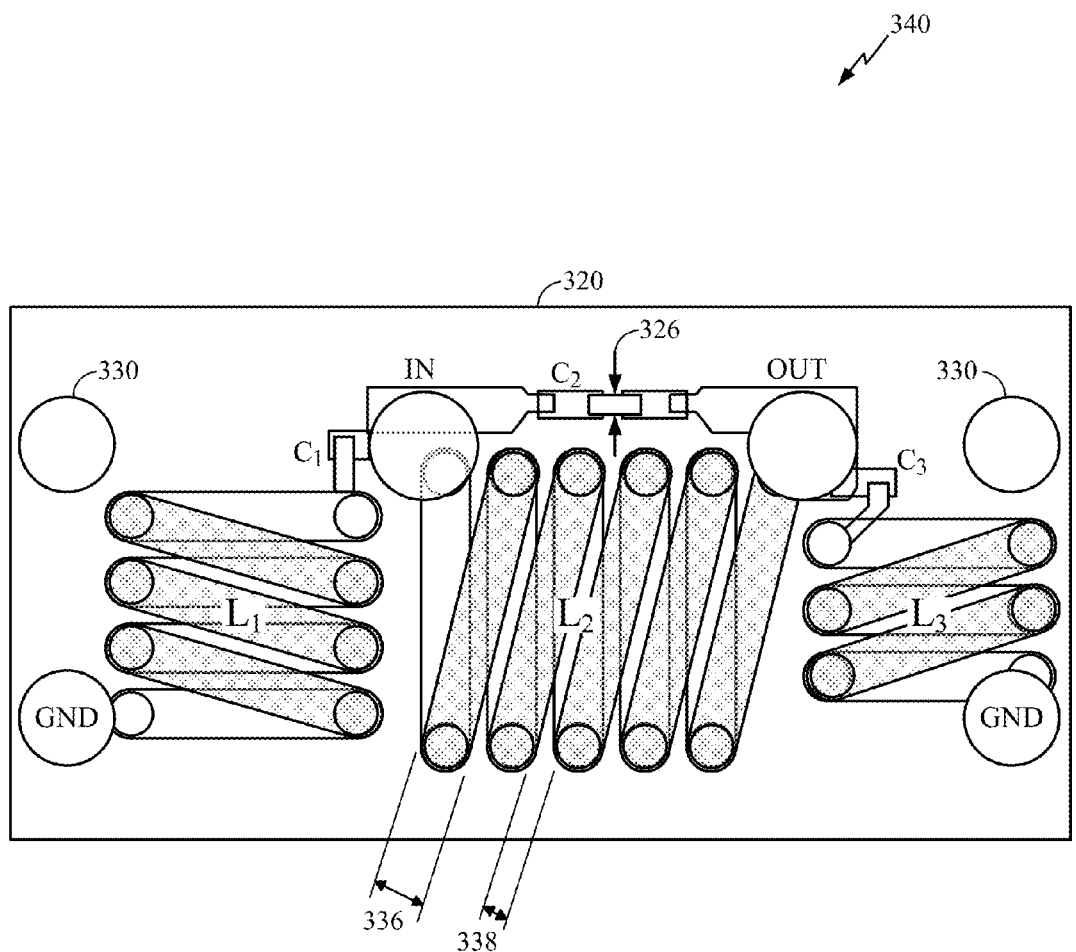
FIG. 3B is a top view of a layout of a filter design according to an aspect of the present disclosure.

FIG. 3B is a top view of a layout of a low pass filter design 340 according to an aspect of the present disclosure. The layout of the low pass filter design 340 of FIG. 3B corresponds to the schematic diagram of the filter design 300 in FIG. 3A. Also, the components are implemented on a semiconductor substrate 320. As described herein, the term "semiconductor substrate" may refer to a substrate of a diced wafer or may refer to the substrate of a wafer that is not diced. In one configuration, the semiconductor substrate is comprised of glass, air, quartz, sapphire, high-resistivity silicon, or other like semiconductor materials or insulating materials.

As shown in FIG. 3B, the input port IN, the output port OUT and the ground terminal GND may be implemented as wafer level chip scale package (WLCSP) balls. In FIGS. 3A and 3B, the capacitors (e.g., the first capacitor ($C_1$), the second capacitor ($C_2$), and the third capacitor ($C_3$)) may be implemented as a structure of thin-film layers (e.g., a layered metal-insulator-metal structure), but are not limited to the structures shown in FIG. 3B. The support element 330 (e.g., balls of a ball grid array) can provide structural support, i.e., they are not electrically coupled to the low pass filter. In some configurations, the interconnects are omitted entirely. Furthermore, the geometry and arrangement of the various inductor and capacitor components in the low pass filter design 340 may reduce the electromagnetic coupling between the components. The various inductor and capacitor components shown in the low pass filter design 340 of FIG. 3B may switch places, while maintaining an equivalent circuit. The low pass filter design 340, therefore, is certainly not limited to what is shown in FIG. 3B.

Figure 3C:
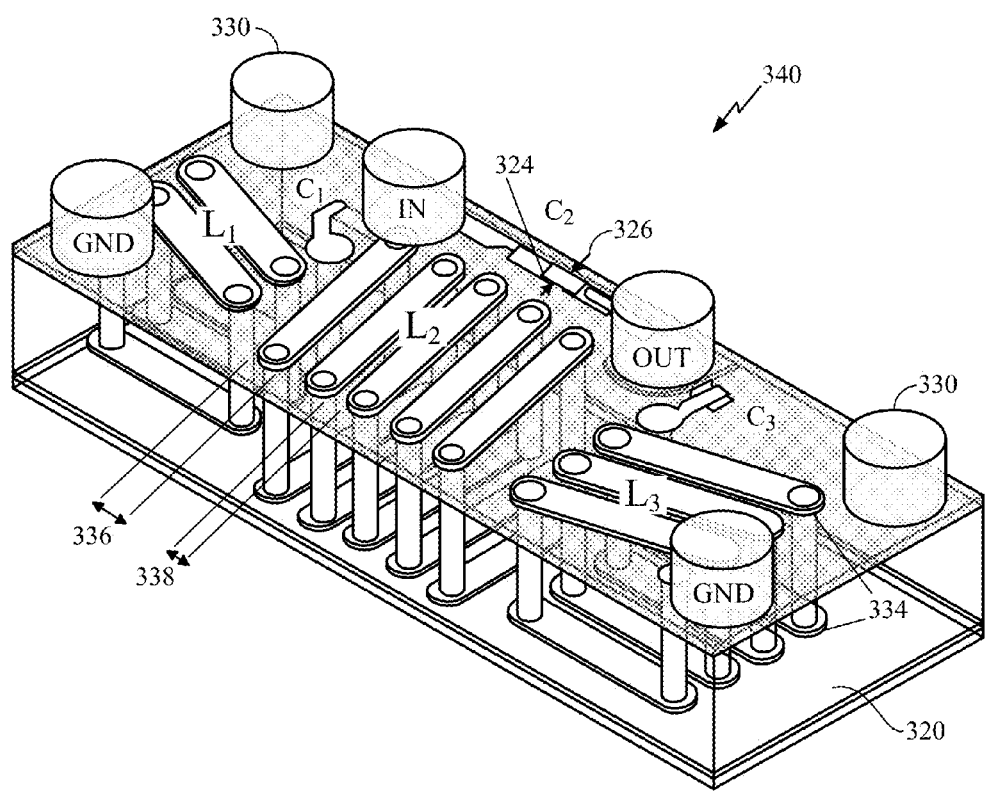
FIG. 3C is a three dimensional view of a layout of a filter design according to an aspect of the present disclosure.

In FIGS. 3A and 3B, the inductors (e.g., the first inductor ($L_1$), the second inductor ($L_2$), and the third inductor ($L_3$)) may be implemented as a series of traces and through substrate vias that are further illustrated in the 3D view of FIG. 3C. The structures of the inductors shown in FIG. 3B are not limited to the structures shown. The layout of the low pass filter design 340 of FIG. 3B is also one implementation of the filter design 300 shown in FIG. 3A.

FIG. 3B also shows a capacitor width 326, an inductor width 336 and an inductor spacing 338. The capacitor width 326 and the inductor width 336 may be similar to the device width 206 of the first device 202 in FIG. 2. The inductor spacing 338 may be similar to the device spacing 208 of the first device 202 in FIG. 2. The capacitor width 326 and the inductor width 336 may be less than a printing resolution width of 10 µm. The inductor spacing 338 may be less than a printing resolution spacing of 10 µm.

FIG. 3C is a 3D view of the low pass filter design 340 in FIG. 3B, and therefore has the same components as shown in FIG. 3B. In FIGS. 3A and 3C, the inductors (e.g., the first inductor ($L_1$), the second inductor ($L_2$), and the third inductor ($L_3$)) are shown as through substrate via inductors (or through glass via inductors when the semiconductor substrate 320 is glass.) Representatively, the inductors (e.g., the first inductor ($L_1$), the second inductor ($L_2$), and the third inductor ($L_3$)) are arranged between a first set of traces on a top surface of the semiconductor substrate 320, and a second set of traces on a second surface of the semiconductor substrate 320 opposite the first surface. In this configuration, the sets of traces are on opposing first and second surfaces of the semiconductor substrate 320 and coupled together by the through substrate vias in a serpentine manner. In FIG. 3C, the semiconductor substrate 320 is transparent to ease the viewing of both sets of traces and the through substrate vias of the first inductor ($L_1$), the second inductor ($L_2$), and the third inductor ($L_3$).

As shown in FIG. 3C, the capacitors (e.g., the first capacitor ($C_1$), the second capacitor ($C_2$), and the third capacitor ($C_3$)) are deposited on the first surface of the semiconductor substrate 320. Also, the input port IN, the output port OUT and the ground terminals GND are on the first surface of the semiconductor substrate 320. The input port IN, the output port OUT and the ground terminals GND may also be accessed by a cylindrical via (or other connection) for electrically coupling to other sources of voltage/current. In one configuration, the size of the low pass filter design 340 is smaller than a conventional filter such as multi-layer ceramic chip devices, 2D planar passive devices, or low temperature co-fired chip devices. Such devices may consume excessive space or use too many resources. Also, such devices may have to be enlarged to lower the insertion loss, which takes up additional resources. The low pass filter design 340 conserves space by using through substrate via inductors and/or through glass via inductors, as well as layered metal-insulator-metal capacitors.

FIG. 3C also shows the capacitor width 326, the inductor width 336 and the inductor spacing 338 from FIG. 3B, as well as a capacitor thickness 324 and an inductor thickness 334. The capacitor thickness 324 and the inductor thickness 334 may be similar to the device thickness 204 of the first device 202 in FIG. 2. The capacitor thickness 324 and the inductor thickness 334 may be less than a printing resolution thickness of 1 µm.

Although the inductor width 336 and the inductor spacing 338 are chosen for a trace of the second inductor ($L_2$), and the inductor thickness 334 is chosen for a trace of the third inductor ($L_3$), the inductor width, the inductor spacing and the inductor thickness values may represent such values for all inductors in the design. Also, although the capacitor width 326 and the capacitor thickness 324 are shown for the second capacitor ($C_2$), the same capacitor width and capacitor thickness values may also apply to the first capacitor ($C_1$) and the third capacitor ($C_3$).

Figure 4A:
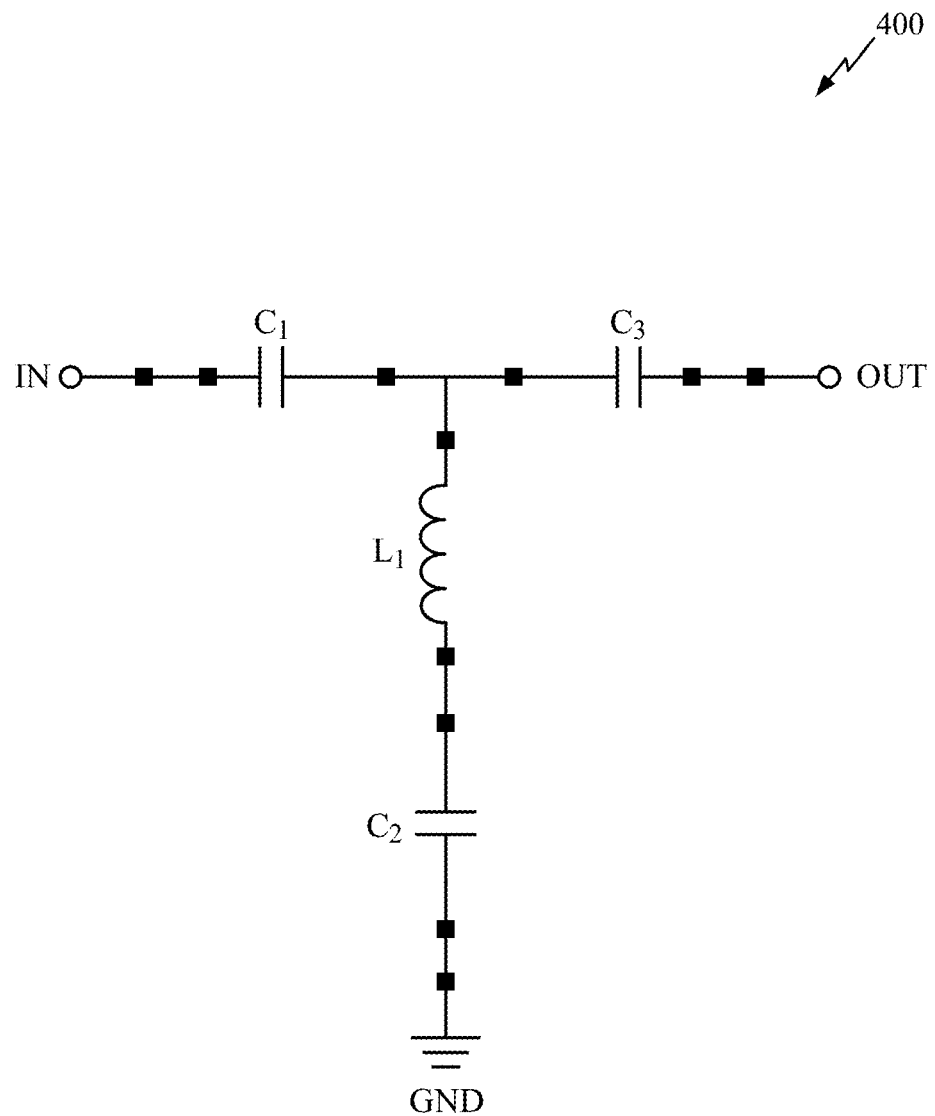
FIG. 4A is a schematic diagram of a filter design according to an aspect of the present disclosure.

FIG. 4A is a schematic diagram of a filter design 400 according to an aspect of the present disclosure. In one configuration, the filter design 400 is for a high pass filter. The filter design 400 includes an input port (IN) coupled to a first capacitor ($C_1$). The first capacitor ($C_1$) is coupled to a first inductor ($L_1$) and a third capacitor ($C_3$). The first inductor ($L_1$) is coupled to a second capacitor ($C_2$). The second capacitor ($C_2$) is coupled to a ground terminal (GND). The third capacitor ($C_3$) is coupled to an output port (OUT). In one configuration, any of the inductor or capacitor locations may be switched, while maintaining an equivalent circuit. For example, the first inductor ($L_1$) and the second capacitor ($C_2$) may be switched and be interchangeable because they are in series. The configurations of the filter design 400 are, therefore, not limited to what is shown in FIG. 4A. For example, the input and output ports can be swapped.

Figure 4B:
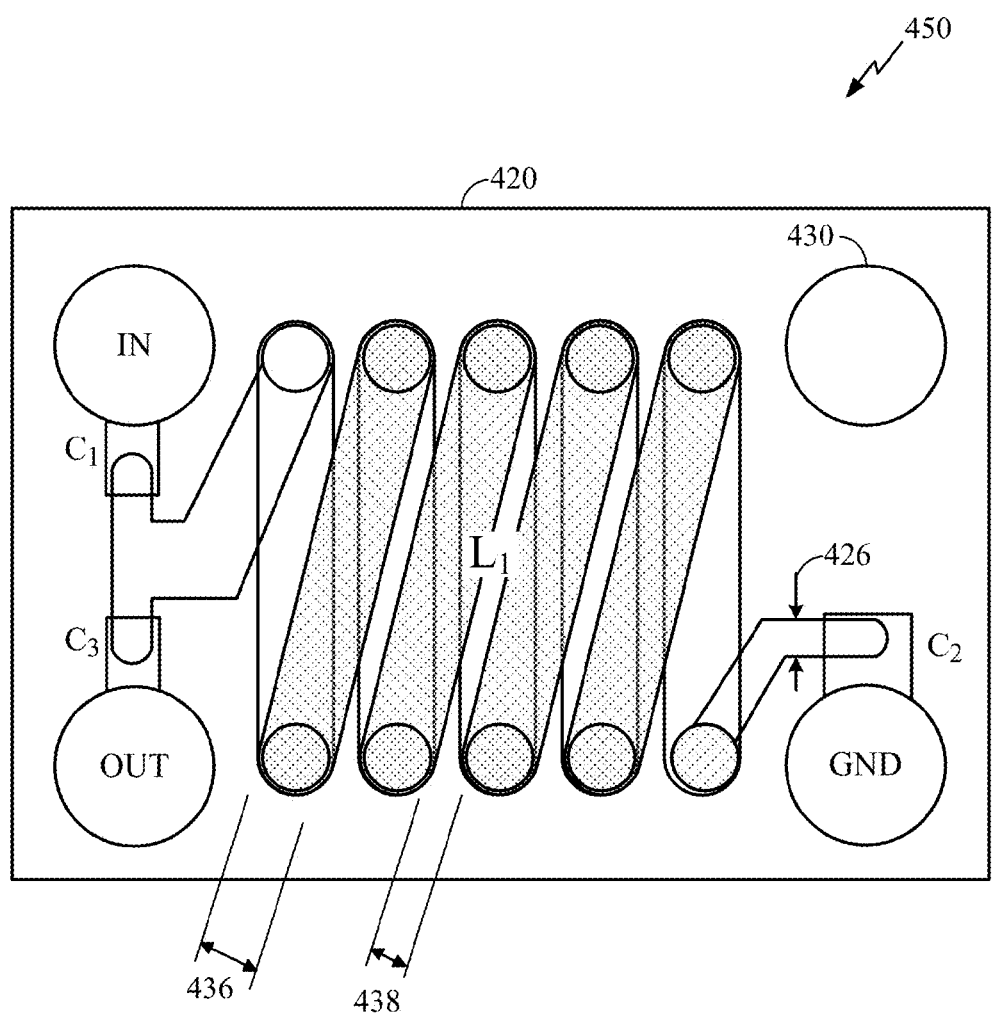
FIG. 4B is a top view of a layout of a filter design according to an aspect of the present disclosure.

FIG. 4B is a top view of a layout of a high pass filter design 450 according to an aspect of the present disclosure. The layout of the high pass filter design 450 of FIG. 4B corresponds to the schematic diagram of the filter design 400 from FIG. 4A. Also, the components are implemented on a semiconductor substrate 420. In this configuration, the input port IN, the output port OUT and the ground terminal GND may be implemented as wafer level chip scale package (WLCSP) balls, although any suitable implementation could be used alternatively. Similarly, the support element 430 may be implemented as a WLCSP ball, or may be omitted altogether.

In FIG. 4A and FIG. 4B, the capacitors (e.g., the first capacitor ($C_1$), the second capacitor ($C_2$), and the third capacitor ($C_3$)) may be implemented as a layered structure (e.g., a layered metal-insulator-metal capacitor structure), but are not limited to such structures. In one configuration, the capacitor is on one side of the semiconductor substrate 420 to conserve space and materials. Furthermore, the geometry and arrangement of the various inductor and capacitor components in the high pass filter design 450 reduce the electromagnetic coupling between the components. In one configuration, the various inductor and capacitor components shown in the high pass filter design 450 of FIG. 4B may switch locations, while maintaining an equivalent circuit. The configurations of the high pass filter design 450 are not limited to what is shown in FIG. 4B.

Figure 4C:
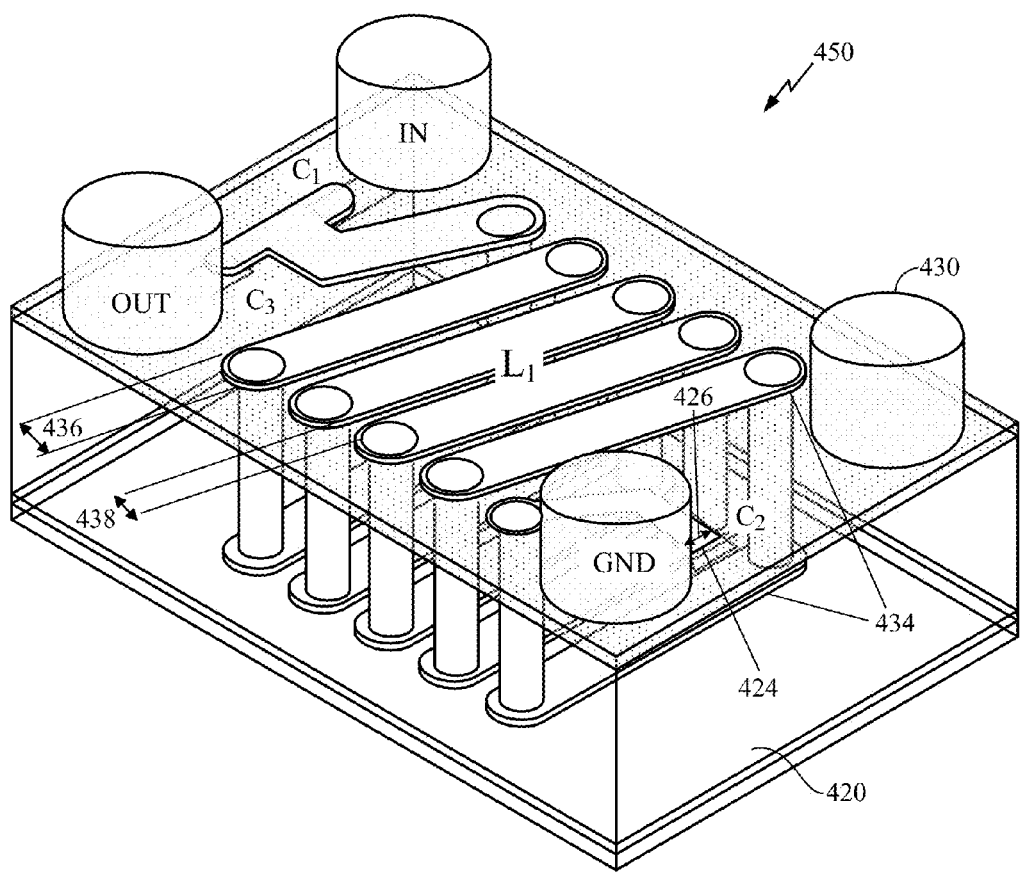
FIG. 4C is a three dimensional view of a layout of a filter design according to an aspect of the present disclosure.

In this configuration, the first inductor ($L_1$) may be implemented as a series of traces and through substrate vias that are further illustrated in the 3D view of FIG. 4C. A more detailed explanation of the inductor is provided in FIG. 4C. Again, the structure of the inductor shown in FIG. 4B is not limited to the structure shown and can take on any structure. The layout of the high pass filter design 450 of FIG. 4B is also one implementation of the filter design 400 shown in FIG. 4A.

FIG. 4B also shows a capacitor width 426, an inductor width 436 and an inductor spacing 438. The capacitor width 426 and the inductor width 436 may be similar to the device width 206 of the first device 202 in FIG. 2, and the capacitor width 326 and the inductor width 336 of FIGS. 3B-3C. The inductor spacing 438 may be similar to the device spacing 208 of the first device 202 in FIG. 2, and the inductor spacing 338 of FIGS. 3B-3C. The capacitor width 426 and the inductor width 436 may be less than a printing resolution width of 10 μm. The inductor spacing 438 may be less than a printing resolution spacing of 10 μm.

FIG. 4C is a 3D view of the high pass filter design 450 in FIG. 4B. In FIG. 4C, the first inductor ($L_1$) is shown as a through substrate via inductor (e.g., a through glass via inductor if the semiconductor substrate 420 is glass). Representatively, the first inductor ($L_1$) may have a first set of traces on a first surface of the semiconductor substrate 420, and a second set of traces on a second surface of the semiconductor substrate 420. In this configuration, the sets of traces are on opposing first and second surfaces of the semiconductor substrate 420 and coupled together by the through substrate vias in a serpentine manner. In FIG. 4C, the semiconductor substrate 420 is transparent to ease the viewing of both sets of traces and the through substrate vias of the inductors.

As shown in FIG. 4C, the capacitors (e.g., the first capacitor ($C_1$), the second capacitor ($C_2$), and the third capacitor ($C_3$)) may be deposited on the first surface of the semiconductor substrate 420. Also, the input port IN, the output port OUT and the ground terminals GND may be on the first surface of the semiconductor substrate 420. The input port IN, the output port OUT and the ground terminal GND may also be accessed by a cylindrical via (or other connection) for electrically coupling to other sources of voltage or current. In one configuration, the size of the high pass filter design 450 is smaller than conventional filter designs such as multi-layer ceramic chip devices, 2D planar passive devices, or low temperature co-fired chip devices. The high pass filter design 450 conserves space by using through substrate via inductors and/or through glass via inductors and layered metal-insulator-metal capacitors.

FIG. 4C also shows the capacitor width 426, the inductor width 436 and the inductor spacing 438 from FIG. 4B, as well as a capacitor thickness 424 and an inductor thickness 434. The capacitor thickness 424 and the inductor thickness 434 may be similar to the device thickness 204 of the first device 202 in FIG. 2, and the capacitor thickness 324 and the inductor thickness 334 of FIG. 3C. The capacitor thickness 424 and the inductor thickness 434 may be less than a printing resolution thickness of 1 μm. Although the capacitor width 426 and the capacitor thickness 424 are shown for the second capacitor ($C_2$), the same capacitor width and capacitor thickness values may also apply to the first capacitor ($C_1$) and the third capacitor ($C_3$).

In 2D planar passive designs, the insertion loss may only be improved by as little as 15% when the design is made as much as three times larger. The filter designs 340/350 and 440/450 maintain the same die size or may be even smaller than many conventional designs, while providing a 50% or more reduction in insertion loss. For example, an insertion loss of less than 0.2 dB may be achieved with the filter designs 340/350 and 440/450. Alternatively, the insertion loss of other conventional filter designs, such as multi-layer ceramic chip devices, 2D planar passive designs or low temperature co-fired chip designs, may have an insertion loss as high as 0.3 dB.

In one configuration, thick conductive films (e.g., metal) may be used on both sides of the capacitors to give the capacitors a high Q (or quality) factor. In one example, the bottom plate may have conductive film with a thickness of 1 μm up to 5 μm and the top plate may have conductive film with a thickness of 1 μm up to 3 μm. This may be uncommon in traditional CMOS based capacitors, which often use thin metals (e.g., 100 to 200 nm). In this configuration, the semiconductor substrate (e.g., the semiconductor substrates 320 and 420) may be fabricated from a low loss material that includes glass, air, quartz, sapphire, high-resistivity silicon, or other like semiconductor materials. In one configuration, the capacitor may also be disposed on only one side of the semiconductor substrate (e.g., semiconductor substrates 320 and 420). In one configuration, the inductors (e.g., when the semiconductor substrates 320 and 420 are glass) are known as through glass via inductors. Such a through glass via implementation may also give the inductors a high Q (or quality) factor and also high inductance density per area.

Figure 5:
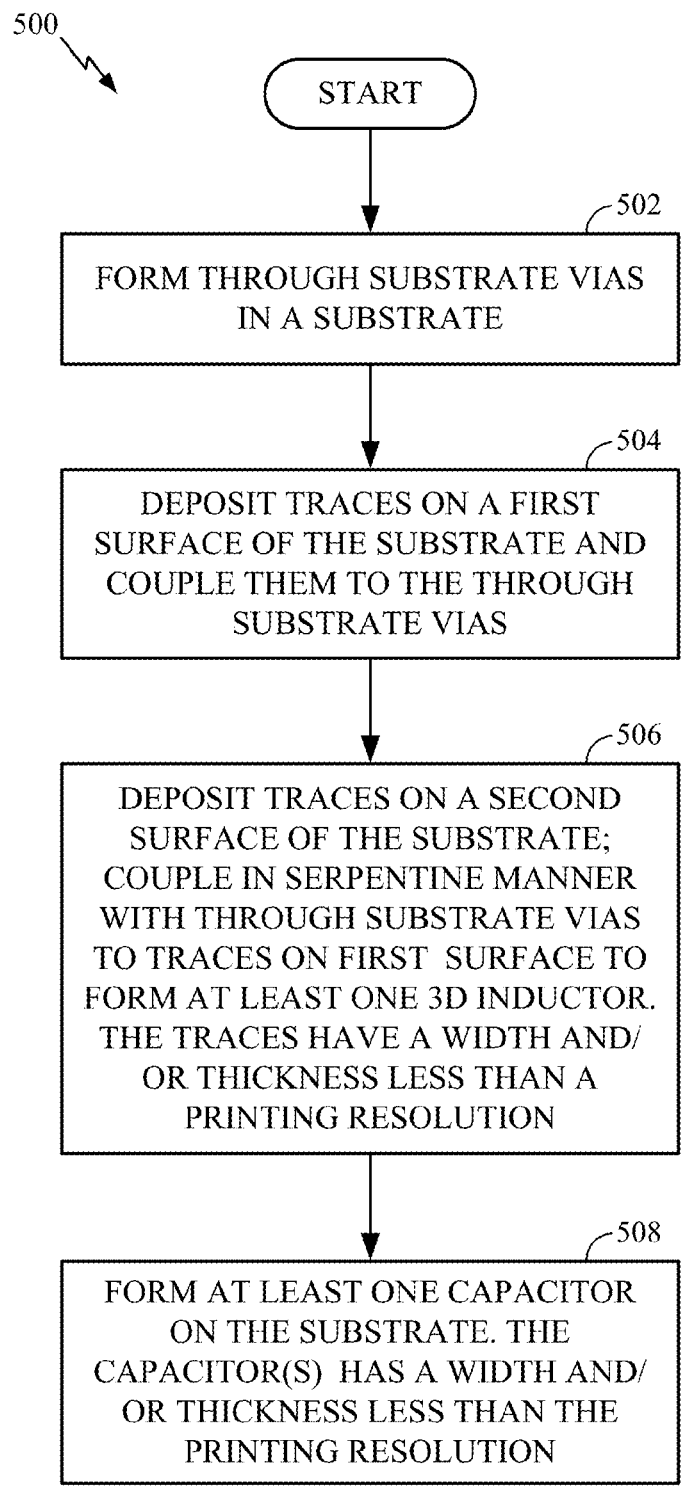
FIG. 5 is a process flow diagram illustrating a method of making a filter design according to an aspect of the present disclosure.

FIG. 5 is a process flow diagram illustrating a method 500 of making a filter design according to an aspect of the present disclosure. In block 502, through substrate vias are formed in a substrate. In block 504, a first set of traces are deposited on a first surface of the substrate and coupled to the through substrate vias. In block 506, a second set of traces are deposited on a second surface of the substrate. The traces on the first surface are coupled to the traces on the second surface by the through substrate vias in a serpentine manner to create at least one 3D inductor. The traces may also have a width and/or thickness less than a printing resolution. In one configuration, the second surface of the substrate is opposite to the first surface of the substrate. In block 508, at least one capacitor is formed on the substrate. The capacitor may also have a width and/or thickness less than the printing resolution. The capacitor may also be formed on only one side of the substrate to conserve space and materials.

Although blocks are shown in a particular sequence, the present disclosure is not so limited. For example, block 508 (forming at least one capacitor on the substrate) may be performed prior to block 504 (depositing traces on a first surface of the substrate). In another example, block 508 (forming at least one capacitor on the substrate) may be performed prior to block 506 (depositing traces on a second surface of the substrate). The end result is a filter design, such as for the low pass filter design 340 of FIGS. 3A-3C and/or the high pass filter design 450 of FIGS. 4A-4C.

The width and/or thickness of all the capacitors in the above designs may be less than a printing resolution. The width and/or thickness of all the inductor traces in the above designs may be less than the printing resolution. In one configuration, the printing resolution has a width of 10 μm and a thickness of 1 μm.

According to a further aspect of the present disclosure, circuitry for filter designs using through glass via or through substrate via technology is described. The filter includes a substrate having through substrate vias. The filter also includes a first means for coupling the through substrate vias on a first surface of the substrate. The filter further includes a second means for coupling the opposite ends of the through substrate vias on a second surface of the substrate opposite the first surface. In this configuration, the through substrate vias and the first and second means for coupling operate as at least one 3D inductor. The first and second means for coupling may be the traces shown in FIGS. 3B, 3C, 4B and 4C.

In this configuration, the filter also includes a means for storing charge supported by the substrate. The charge storing means may be the capacitors in FIGS. 3A-3C and/or FIGS. 4A-4C (e.g., the first capacitor ($C_1$), the second capacitor ($C_2$), and the third capacitor ($C_3$) of FIGS. 3A-3C and the first capacitor ($C_1$), the second capacitor ($C_2$), and the third capacitor ($C_3$) of FIGS. 4A-4C). In another aspect, the aforementioned means may be any module or any apparatus configured to perform the functions recited by the aforementioned means.

In one configuration, the width and/or thickness of the capacitors and the inductors is less than a printing resolution. A printing resolution may be the resolution of printing processes such as multi-layer ceramic processes or low temperature co-fired ceramic processes that may also use lamination or printed circuit boards (PCBs). In one configuration, the printing resolution has a width of 10 μm or greater and a thickness of 1 μm or greater. For example, the width values apply to the trace widths of the inductors and the thickness values apply to the trace thicknesses of inductors or the thicknesses of the dielectric material or other films used in a capacitor.

Printing processes may also not have a printing resolution to fabricate devices having, for example, dimensions of 10 μm×10 μm or less, a line spacing of 10 μm or less, or dielectric materials having a thickness of less than 330 nm. For example, a printing process may also not have the printing resolution to fabricate a 200 nm layer of dielectric material between two conductive layers.

In one configuration, the substrate is glass. Devices such as multi-layer ceramic capacitors may not be fabricated from glass or be built on glass. Glass may have the advantage of having low loss properties, or having a low loss tangent, which means that less loss and/or dissipation of electromagnetic energy occurs at RF frequencies. Glass may also have a low dielectric constant, which means less parasitic capacitance. Glass may also be an inexpensive material, having low fabrication costs compared to printed circuit boards (PCBs), and may also be readily available in terms of manufacturing materials.

Using a semiconductor process instead of a printing process (e.g., low temperature co-fired ceramic processes or multi-layer ceramic processes) enables fabrication of smaller trace sizes and/or smaller device sizes (e.g., device sizes less than half the size of other processes) with better process control and device uniformity while meeting or exceeding the performance of larger devices. Using a semiconductor process instead of a printing process also enables tighter control of the tolerance of feature sizes.

For example, in fabricating a device such as a capacitor, the present disclosure can exercise a tight tolerance of 10 μm±3%. Conversely, printing processes have a tolerance of 10 μm±15%, which is a large variation that may lead to the malfunctioning of a device. The semiconductor process of the present disclosure enables manufacturing of smaller pitch sizes between vias. Fabricating at smaller pitch sizes increases the number of vias that may fit into the same area. In addition, small inductors may also be fabricated by having smaller pitch sizes. Furthermore, more turns can be fabricated into a single inductor. Increasing the turns of an inductor increases the inductance value of the inductor. The increased inductor turns may also maintain the same inductance value within a smaller area, which improves manufacturing efficiency, reduces the device size and lowers the unit device cost.

Figure 6:
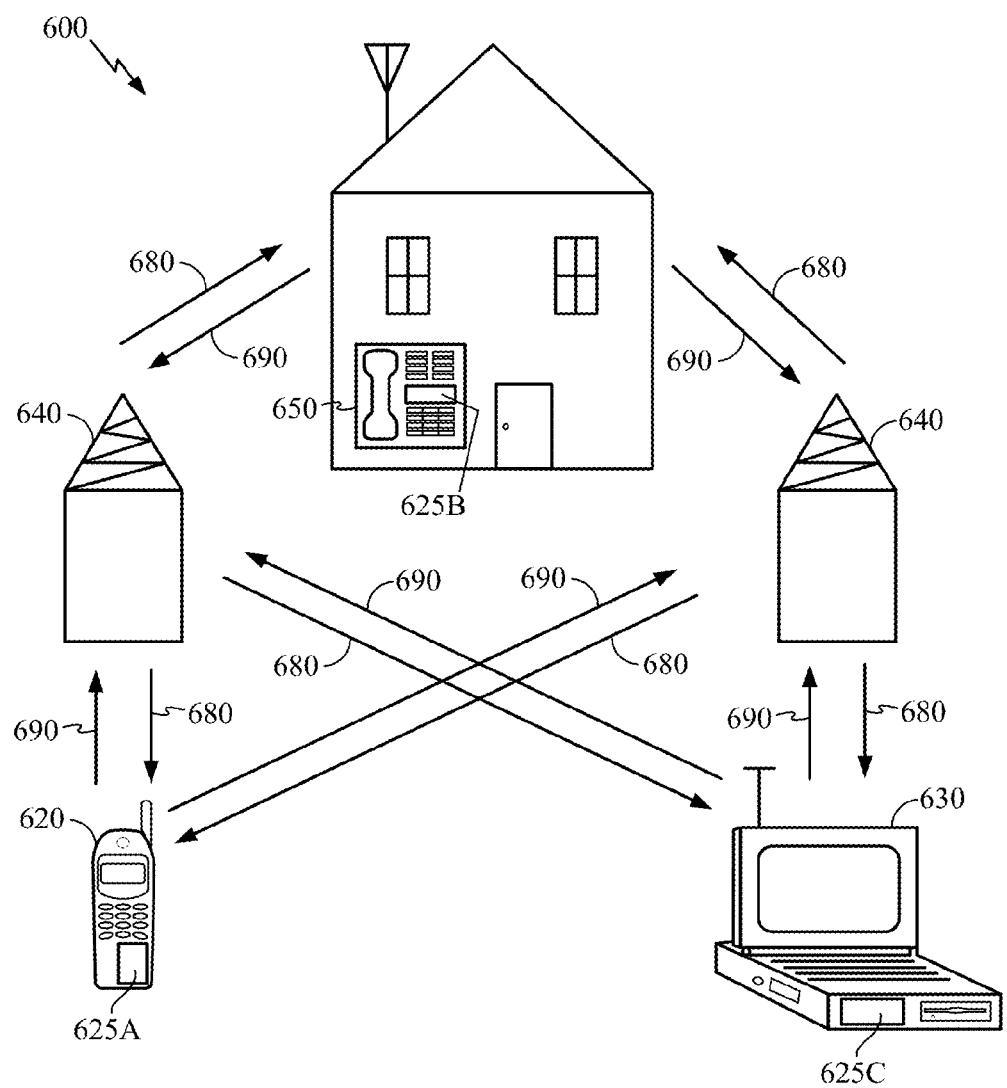
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed filter devices. It will be recognized that other devices may also include the disclosed filter devices, such as the base stations, switching devices, and network equipment. FIG. 6 shows forward link signals 680 from the two base stations 640 to the remote units 620, 630, and 650 and reverse link signals 690 from the remote units 620, 630, and 650 to the two base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed filter devices.

Figure 7:
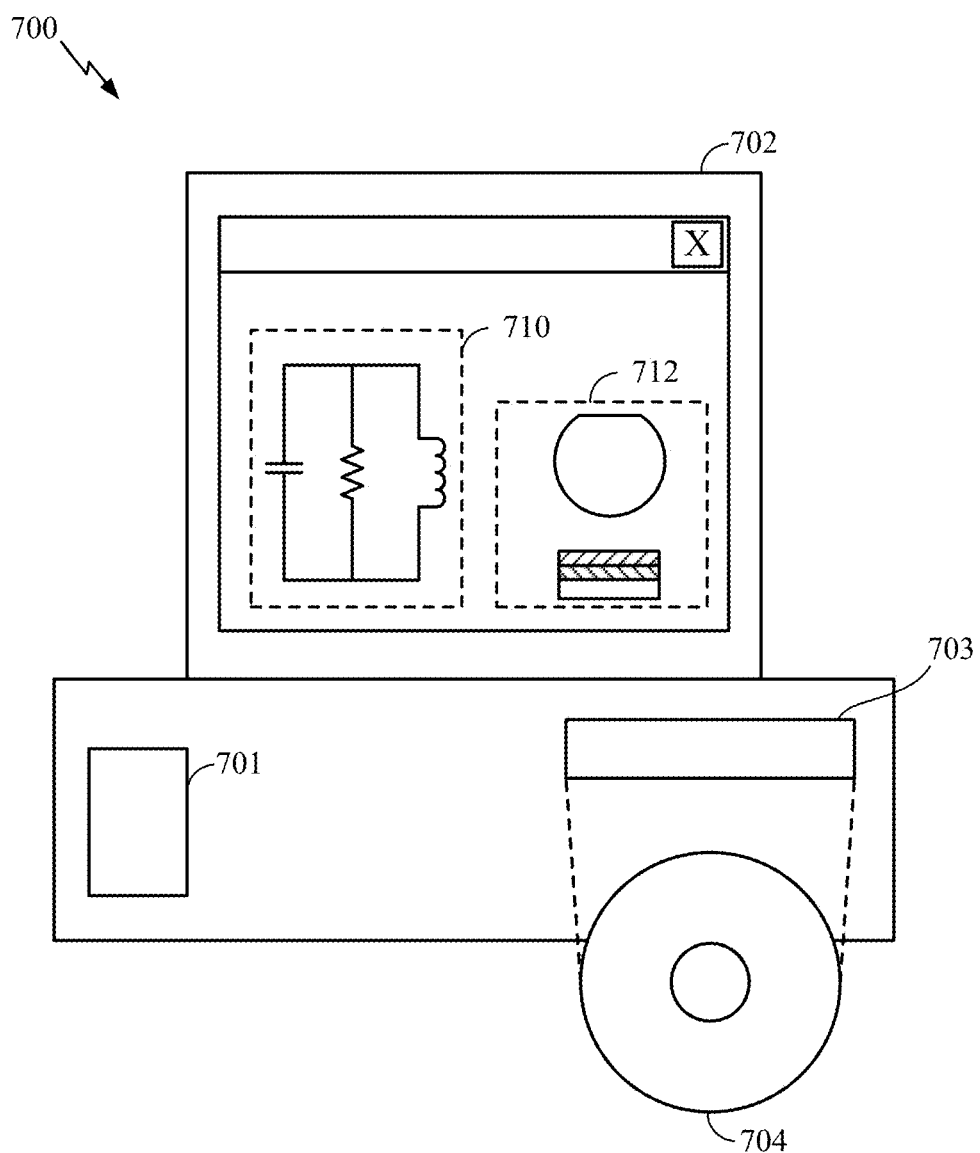
FIG. 7 is a block diagram illustrating a design workstation used for circuit, layout, and logic design of a semiconductor component according to one configuration.

FIG. 7 is a block diagram illustrating a design workstation used for circuit, layout, and logic design of a semiconductor component, such as the filter devices disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a filter device. A storage medium 704 is provided for tangibly storing the design of the circuit 710 or the semiconductor component 712. The design of the circuit 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit 710 or the semiconductor component 712 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A filter fabricated using a semiconductor process, comprising:
    a glass substrate having a plurality of through substrate vias;
    a plurality of capacitors supported by the glass substrate, a width of at least one of the plurality of capacitors being less than ten micrometers and a thickness of the at least one capacitor being less than one micrometer, the width and thickness of the at least one capacitor being less than a width and thickness of a capacitor fabricated using a printing process; and
    at least one 3D inductor within the glass substrate having an inductor spacing of less than a printing resolution spacing of ten micrometers, the at least one 3D inductor comprising:
        a first plurality of traces on a first surface of the glass substrate, coupled to the plurality of through substrate vias; and
        a second plurality of traces on a second surface of the glass substrate, opposite the first surface, coupled to opposite ends of the plurality of through substrate vias, the plurality of through substrate vias and traces surrounding a solid glass core of the glass substrate and operating as the at least one 3D inductor, the first plurality of traces and the second plurality of traces having a width and/or thickness less than the printing resolution in which at least one of the plurality of capacitors is coupled to a trace of the at least one 3D inductor.

2. The filter of claim 1, in the filter comprises a low pass filter.

3. The filter of claim 1, in which the filter comprises a high pass filter.

4. The filter of claim 1, in which the glass substrate comprises glass, air, quartz, sapphire or high-resistivity silicon.

5. The filter of claim 1, integrated into a mobile phone, a set top box, a music player, a video player, an entertainment unit, a navigation device, a computer, a hand-held personal communication systems (PCS) unit, a portable data unit, and/or a fixed location data unit.

6. A low pass filter, comprising:
    a glass substrate having a plurality of through substrate vias;
    a plurality of capacitors supported by the glass substrate, at least one of the plurality of capacitors having a width and/or thickness less than a printing resolution;
    at least one 3D inductor within the glass substrate, the at least one 3D inductor comprising:
        a first plurality of traces on a first surface of the glass substrate, coupled to the plurality of through substrate vias, and
        a second plurality of traces on a second surface of the glass substrate, opposite the first surface, coupled to opposite ends of the plurality of through substrate vias, the plurality of through substrate vias and traces operating as the at least one 3D inductor, the first plurality of traces and the second plurality of traces having a width and/or thickness less than the printing resolution;
    a first of the 3D inductors coupled in series to a first of the plurality of capacitors, between a filter input and a ground terminal;
    a second of the 3D inductors coupled between the filter input and a filter output and coupled in parallel to a second of the plurality of capacitors; and
    a third of the 3D inductors coupled to the filter output and to a third of the plurality of capacitors that is coupled to the ground terminal.

7. A low pass filter, comprising:
    a glass substrate having a plurality of through substrate vias;

a plurality of capacitors supported by the glass substrate, at least one of the plurality of capacitors having a width and/or thickness less than a printing resolution;

at least one 3D inductor within the glass substrate, the at least one 3D inductor comprising:
- a first plurality of traces on a first surface of the glass substrate, coupled to the plurality of through substrate vias, and
- a second plurality of traces on a second surface of the glass substrate, opposite the first surface, coupled to opposite ends of the plurality of through substrate vias, the plurality of through substrate vias and traces operating as the at least one 3D inductor, the first plurality of traces and the second plurality of traces having a width and/or thickness less than the printing resolution;

a first of the plurality of capacitors coupled in series to a first of the 3D inductors, between a filter input and a ground terminal;

a second of the plurality of capacitors coupled between the filter input and a filter output and coupled in parallel to a second of the 3D inductors; and a third of the plurality of capacitors is coupled to the filter output and to a third of a third of the 3D inductors that is coupled to the ground terminal.

8. A high pass filter, comprising:

a glass substrate having a plurality of through substrate vias;

a plurality of capacitors supported by the glass substrate, at least one of the plurality of capacitors having a width and/or thickness less than a printing resolution;

at least one 3D inductor within the glass substrate, the at least one 3D inductor comprising:
- a first plurality of traces on a first surface of the glass substrate, coupled to the plurality of through substrate vias, and
- a second plurality of traces on a second surface of the glass substrate, opposite the first surface, coupled to opposite ends of the plurality of through substrate vias, the plurality of through substrate vias and traces operating as the at least one 3D inductor, the first plurality of traces and the second plurality of traces having a width and/or thickness less than the printing resolution;

a first of the plurality of capacitors coupled in series with a third of the plurality of capacitors, between a filter input and a ground terminal; and the at least one 3D inductor coupled in series with a second of the plurality of capacitors between the first of the plurality of capacitors and the third of the plurality of capacitors and the ground terminal.

9. A high pass filter, comprising:

a glass substrate having a plurality of through substrate vias;

a plurality of capacitors supported by the glass substrate, at least one of the plurality of capacitors having a width and/or thickness less than a printing resolution;

at least one 3D inductor within the glass substrate, the at least one 3D inductor comprising:
- a first plurality of traces on a first surface of the glass substrate, coupled to the plurality of through substrate vias, and
- a second plurality of traces on a second surface of the glass substrate, opposite the first surface, coupled to opposite ends of the plurality of through substrate vias, the plurality of through substrate vias and traces operating as the at least one 3D inductor, the first plurality of traces and the second plurality of traces having a width and/or thickness less than the printing resolution;

a first of the plurality of capacitors coupled in series with a second of the plurality of capacitors, between a filter input and a ground terminal; and the at least one 3D inductor coupled between the first of the plurality of capacitors and the second of the plurality of capacitors and the ground terminal.

10. A method of fabricating a filter, comprising:

forming a plurality of through substrate vias in a glass substrate;

depositing a first plurality of traces on a first surface of the glass substrate;

depositing a second plurality of traces on a second surface of the glass substrate, the first plurality of traces and the second plurality of traces having a width and/or thickness less than a printing resolution;

coupling the first plurality of traces to first sides of the plurality of through substrate vias;

coupling the second plurality of traces to second sides of the plurality of through substrate vias, the plurality of through substrate vias and traces surrounding a solid glass core of the glass substrate to form at least one 3D inductor; and forming at least one capacitor on the glass substrate, a width of the at least one capacitor being less than ten micrometers and a thickness of the at least one capacitor less than one micrometer, the width and thickness of the at least one capacitor being less than a width and thickness of a capacitor fabricated using a printing process, in which the at least one capacitor is coupled to a trace of the at least one 3D inductor.

11. The method of claim 10, in which the filter is fabricated as a low pass filter.

12. The method of claim 10, in which the filter is fabricated as a high pass filter.

13. The method of claim 10, further comprising integrating the filter into a mobile phone, a set top box, a music player, a video player, an entertainment unit, a navigation device, a computer, a hand-held personal communication systems (PCS) unit, a portable data unit, and/or a fixed location data unit.

14. A filter comprising:

a glass substrate having a plurality of through substrate vias;

means for storing charge supported by the glass substrate, a width of the charge storing means being less than ten micrometers and a thickness of the charge storing means less than one micrometer, the width and thickness of the charge storing means being less than a width and thickness of a capacitor fabricated using a printing process; and at least one 3D inductor within the glass substrate, the at least one 3D inductor comprising:
- first means for coupling on a first surface of the glass substrate, the first means for coupling coupled to the plurality of through substrate vias; and
- second means for coupling on a second surface of the glass substrate, opposite the first surface, the second means for coupling coupled to opposite ends of the plurality of through substrate vias, the plurality of through substrate vias, the first means for coupling and the second means for coupling surrounding a solid glass core of the glass substrate and operating as the at least one 3D inductor, the first means for coupling and the second means for coupling having a width and/or thickness less than the printing resolution in which the charge storing means is coupled to the first coupling means of the at least one 3D inductor.

15. The filter of claim 14, integrated into a mobile phone, a set top box, a music player, a video player, an entertainment unit, a navigation device, a computer, a hand-held personal communication systems (PCS) unit, a portable data unit, and/or a fixed location data unit.

16. A low pass filter, comprising:
a glass substrate having a plurality of through substrate vias;
means for storing charge supported by the glass substrate, the charge storing means having a width and/or thickness less than a printing resolution;
at least one 3D inductor within the glass substrate, the at least one 3D inductor comprising:
first means for coupling on a first surface of the glass substrate, the first means for coupling coupled to the plurality of through substrate vias, and
second means for coupling on a second surface of the glass substrate, opposite the first surface, the second means for coupling coupled to opposite ends of the plurality of through substrate vias, the plurality of through substrate vias, the first means for coupling and the second means for coupling operating as the at least one 3D inductor, the first means for coupling and the second means for coupling having a width and/or thickness less than the printing resolution;
a first of the 3D inductors coupled in series to a first of the charge storing means, between a filter input and a ground terminal;
a second of the 3D inductors coupled between the filter input and a filter output and coupled in parallel to a second of the charge storing means; and
a third of the 3D inductors coupled to the filter output and to a third of the charge storing means that is coupled to the ground terminal.

17. A high pass filter, comprising:
a glass substrate having a plurality of through substrate vias;
means for storing charge supported by the glass substrate, the charge storing means having a width and/or thickness less than a printing resolution;
at least one 3D inductor within the glass substrate, the at least one 3D inductor comprising:
first means for coupling on a first surface of the glass substrate, the first means for coupling coupled to the plurality of through substrate vias, and
second means for coupling on a second surface of the glass substrate, opposite the first surface, the second means for coupling coupled to opposite ends of the plurality of through substrate vias, the plurality of through substrate vias, the first means for coupling and the second means for coupling operating as the at least one 3D inductor, the first means for coupling and the second means for coupling having a width and/or thickness less than the printing resolution;
a first of the charge storing means coupled in series with a third of the charge storing means, between a filter input and a ground terminal; and
the at least one 3D inductor coupled in series with a second of the charge storing means between the first charge storing means and the third charge storing means and the ground terminal.

18. A method of fabricating a filter, comprising:
the step of forming a plurality of through substrate vias in a glass substrate;
the step of depositing a first plurality of traces on a first surface of the glass substrate;
the step of depositing a second plurality of traces on a second surface of the glass substrate, the first plurality of traces and the second plurality of traces having a width and/or thickness less than a printing resolution;
the step of coupling the first plurality of traces to first sides of the plurality of through substrate vias;
the step of coupling the second plurality of traces to second sides of the plurality of through substrate vias, the plurality of through substrate vias and traces surrounding a solid glass core of the glass substrate to form at least one 3D inductor; and
the step of forming at least one capacitor on the glass substrate, a width of the at least one capacitor being less than ten micrometers and a thickness of the at least one capacitor less than one micrometer, the width and thickness of the at least one capacitor being less than a width and thickness of a capacitor fabricated using a printing process.

19. The method of claim 18, in which the filter is fabricated as a low pass filter.

20. The method of claim 18, in which the filter is fabricated as a high pass filter.

21. The method of claim 18, further comprising the step of integrating the filter into a mobile phone, a set top box, a music player, a video player, an entertainment unit, a navigation device, a computer, a hand-held personal communication systems (PCS) unit, a portable data unit, and/or a fixed location data unit.

* * * * *